US006603348B1

(12) United States Patent
Preuss et al.

(10) Patent No.: US 6,603,348 B1
(45) Date of Patent: Aug. 5, 2003

(54) CENTER TAP LEVEL CONTROL FOR CURRENT MODE DIFFERENTIAL DRIVER

(75) Inventors: Curtis Walter Preuss, Rochester, MN (US); Charles C. Hanson, Kenyon, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/124,966

(22) Filed: Apr. 18, 2002

(51) Int. Cl.[7] .................................................. G06G 7/12

(52) U.S. Cl. .................. 327/563; 327/65; 327/108; 326/30; 326/83

(58) Field of Search .................... 327/67, 543, 108, 327/112, 170, 563, 65, 588, 423, 424; 330/260, 261; 326/83, 30, 86

(56) References Cited

U.S. PATENT DOCUMENTS 5,939,904 A * 8/1999 Fetterman et al. ............ 327/67
6,356,141 B1 * 3/2002 Yamauchi .................... 327/543

FOREIGN PATENT DOCUMENTS

JP        2000-354055 A  * 12/2000

* cited by examiner

Primary Examiner—Terry D. Cunningham
Assistant Examiner—Long Nguyen
(74) Attorney, Agent, or Firm—Karuna Ojanen

(57) ABSTRACT

A feedback mechanism is provided to a current mode differential driver by connecting the center tap of a terminator of the output of the driver through feedback resistors to the gates of a positive and a negative current source connected to the driver. Connecting the center tap between the feedback resistors, the average common mode voltage at the output of the differential driver is substantially constant which avoids variations and reflective noise in high speed data transmission that can occur because of manufacturing tolerances.

9 Claims, 1 Drawing Sheet

CENTER TAP LEVEL CONTROL FOR CURRENT MODE DIFFERENTIAL DRIVER

FIELD OF THE INVENTION

This invention relates generally to the field of data transmission and more specifically relates to a current mode differential driver stabilized by providing a feedback voltage from the center tap of the driver output to the current source.

BACKGROUND OF THE INVENTION

Increasingly so, today's communication and data processing electronics use lower and lower voltages and faster and faster transmission rates. Voltage levels have gone from five volts to 1.2 volts and lower; data transmission rates are on the order of several gigahertz. Given any bidirectional interface in which data, whether it be optical or electronic, is transmitted and received at a high frequency, it is desirable that the transmission media have a constant source impedance to absorb electromagnetic reflections and not create additional noise. Given modem electronic circuits and boards, some of the sources of electromagnetic discontinuities that create reflections that may cause excess noise include geometric differences in the transmission media and interfaces, multiple loads, different connectors, crossing split reference planes, vias, etc. In other words, for very large scale integrated (VLSI) data processing circuits, it's a dangerous world; a myriad of both temporal and spatial events to degrade a low voltage high frequency electronic signal exists.

In a differential driver, the signal of interest is actually carried by a difference in the voltage or current between two signal lines, rather than between a signal line and a reference. Typically, the two signals are complementary meaning that they may be at or near the same magnitude but of different signs. Previous differential drivers were voltage driven requiring a relatively large power supply with the voltage source in series with the resistance load. A current mode differential driver was created to accommodate the lower voltages and requiring a smaller power supply and still be very responsive. In a current mode driver with constant current source, the voltage levels of the signals basically float between a positive and a negative voltage rather than between some voltage and a reference. Such a current mode driver may include a p-channel type semiconductor current source that provides current to flow through the terminating resistors and/or load and into an n-channel type current source. If the p-channel and the n-channel current sources are perfectly matched, the voltage between the terminating resistors or load would be centered between the +/−voltage range. The current sources, however, cannot be perfectly matched and as a result, the output common mode voltage shifts which is problematic if the receiver on the other end of the transmission line is seeking a signal at a certain common mode voltage. Because of the above-mentioned discontinuities, if the common mode voltage shifts too much, errors will result.

There is thus a need in the industry for a stable current mode differential driver. Objects, features, and characteristics of the invention; methods, operation, and functions of the related elements of the structure; combination of parts; and economies of manufacture will become apparent from the following detailed description of the preferred embodiments and accompanying figures, all of which form a part of this specification, wherein like reference numerals designate corresponding parts in the various figures.

SUMMARY OF THE INVENTION

To satisfy the above objects and to provide the industry with a solution to the problems stated above, what is presented herein is a stabilized current mode differential driver, comprising: a pfet current source; a nfet current source; a current steering network connected to the pfet current source and the nfet current source; a center tap terminator connected to the current steering network; and a feedback network connected to the center tap terminator to provide feedback to the pfet current source and nfet current source to maintain a constant average common mode voltage.

The feedback network may comprise a first feedback resistor connected to a gate of the pfet current source; and a second feedback resistor connected to a gate of the nfet current source. The driver may further comprise first pfet current mirror reference connected to the gate of the pfet current source; and a second nfet current mirror reference connected to the gate of the nfet current source; wherein the first feedback resistor is also connected to the first pfet current mirror reference and the second feedback resistor is also connected to the second nfet current mirror reference.

A complementary signal may drive the current steering network. The current steering network may comprise two pfets, the sources of each being connected to a drain of the pfet current source and the gates of each being connected to each of the complementary signal; and two nfets, the sources of each being connected to the drain of the nfet current source and the gates of each being connected to each of the complementary signal and the drains of one nfet being connected to the drain of one pfet.

The current mode differential driver may have a differential output. The output may be connected to a transmission line having an impedance matching the center tap terminator.

The invention is also considered a current mode differential driver, comprising: a first current mirror and a first current source having a first bias voltage provided by the first current mirror, the first current mirror and the first current source connected to a supply voltage; a second current mirror and a second current source having a second bias voltage provided by the second current mirror, the second current mirror and the second current source connected to a ground voltage; a first input to the gates of one leg of an H-bridge differential driver; a second input to the gates of a second leg of the H-bridge differential driver, the first and second input being complementary signals; a center tap terminator comprising a center tap between a first terminating resistor and a second terminating resistor, the center tap terminator between a first complementary output at the center of the first leg and between a second complementary output at the center of the second leg, and a resistor feedback network in which the center tap terminator is connected between a first feedback resistor of the resistor feedback network and a second feedback resistor of the resistor feedback network wherein the first feedback resistor is connected to the bias voltage of first current source and the second feedback resistor is connected to the bias voltage of the second current source to maintain an average common mode voltage at the center tap terminator.

The invention is further a method to stabilize the output of a current mode differential driver, comprising the steps of: providing a first current to the current mode differential driver, providing a second current to the current mode differential driver; providing a center tap terminator at an output of the current mode differential driver; providing a voltage at a center tap of the center tap terminator to adjust the first current and/or the second current so maintain an average common mode voltage at the center tap terminator. To provide a voltage at the center tap to adjust the first current and/or second current further, the center tap terminator may be connected to a first feedback resistor whose other end is connected to a gate of a first current source providing the first current. The center tap terminator is also connected to a second feedback resistor having another end connected to a gate of a second current source providing the second current in an arrangement such that the center tap terminator is between the first and second feedback resistors.

The invention may further be considered a stable H-bridge differential driver, comprising: a means to provide current to an H-bridge differential driver; a means to input a complementary signal to an H-bridge differential driver; a means to direct the current through the H-bridge differential driver based on the complementary signal; a means to maintain an average common mode voltage at a center tap of the H-bridge differential driver substantially constant. The means to provide current may be a pfet having a drain connected to a top of the H-bridge differential driver and an nfet having a drain connected to a bottom of the H-bridge differential driver. The means to direct the current through the H-bridge differential driver may further comprise a leg pfet and a leg nfet wherein a gate of the leg pfet is connected to an input signal and a gate of the leg nfet is connected to the complement of the input signal, and the drain of the leg pfet is connected through a center tap terminator to the drain of the leg nfet, and the source of leg pfet is connected to the drain of the pfet and the source of the leg nfet is connected to the drain of nfet. The means to maintain the average common mode voltage to be substantially constant may further comprise a feedback resistor network connected between the center tap terminator and the means to provide current.

DESCRIPTION OF THE DRAWING

Thus, having been summarized, the invention will best be understood by reference to the following description and the Drawing in which.

DETAILED DESCRIPTION OF THE INVENTION

Figure 1:
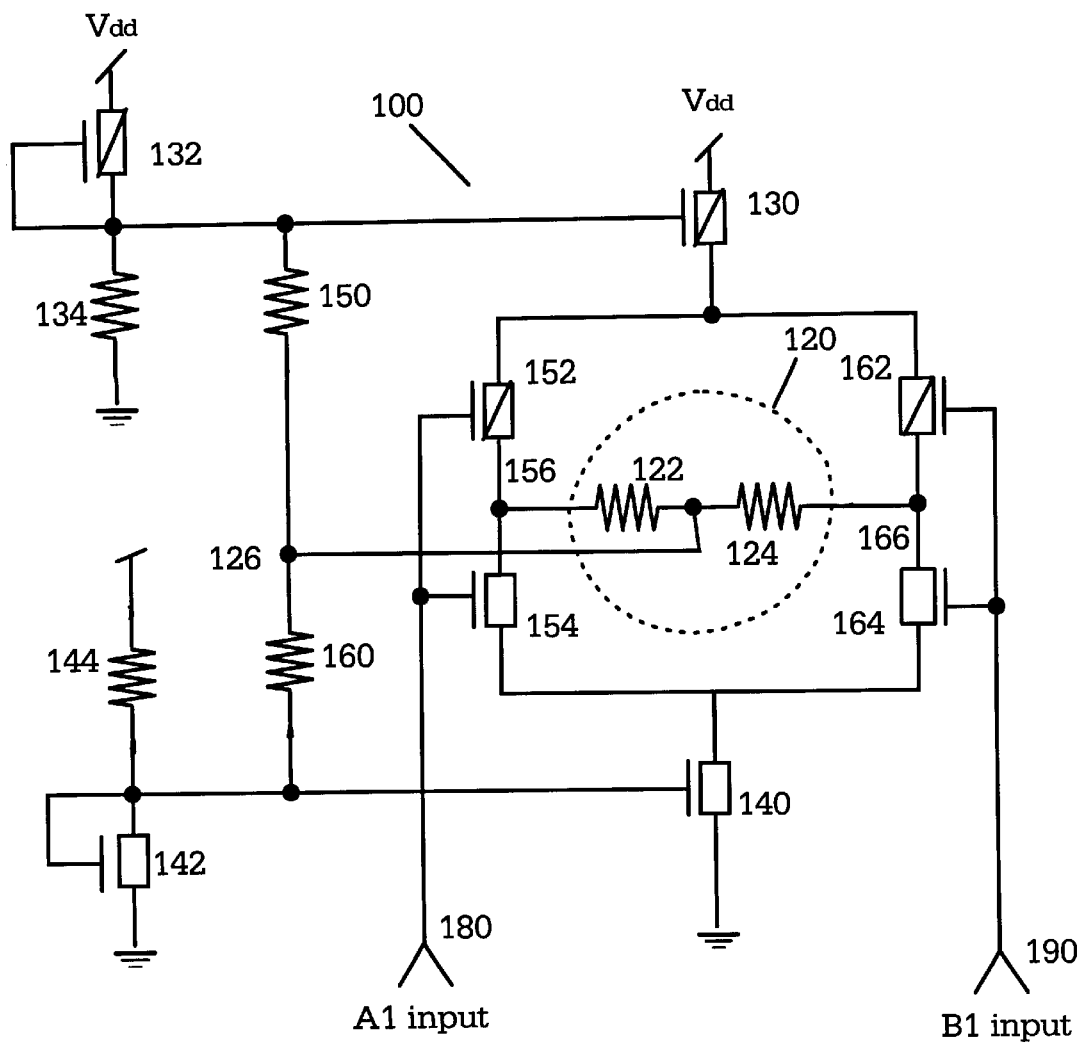
FIG. 1 is a schematic of a current mode differential driver that is stabilized by a center tap in accordance with an embodiment of the invention.

FIG. 1 is a schematic of a stabilized current mode differential driver 100 which may embody the current mode different driver of U.S. Pat. No. 6,304,106 B1 entitled "CMOS Bi-directional Current Mode Differential Link with Precompensation" issued Oct. 16, 2001, commonly assigned to the assignee and herein incorporated by reference in its entirety. The driver 100 preferably provides a high-speed serial or parallel electrical interface for connecting hosts, such as computer or device processors, switches, and peripherals through an electronic interface. Furthermore, although the integrated circuits herein are usually of silicon CMOS and/or bipolar semiconductor technologies, one of skill in the art will understand that other semiconductor materials may be used for other speeds of data transmission. In the Gigabit Ethernet environment, for example, driver 100 can be used in such hosts as local area network (LAN) switches or hubs, as well as in interconnecting processors. In storage area networks (SANs) as hosts, the driver 100 can be used for transmitting data between peripheral devices and processors. Thus, the host may be an electronic switch, a network interface to another system, a computer, a processor with a computer; indeed, any electronic device which may transmit and receive data to/from the driver 100.

The differential driver 100 of FIG. 1 provides two current sources 130 and 140 connected to a current steering network. The current steering network is connected to the output and a center tap terminator which in turn is connected to a feedback network. The feedback network provides a voltage feedback to the current sources.

The current sources are a p-type field effect transistor (pfet) 130 and a n-type field effect transistor (nfet) 140. The function of the pfet 130 will be described with the understanding that the nfet 140 functions similarly as is known in the art. The bias voltage at the gate of pfet 130 is provided by a current mirror reference comprising pfet 132 and resistor 134. Current attempts to flow through pfet 132 connected to a supply voltage, $V_{dd}$. The gate of pfet 132 is coupled to its drain, effectively connecting pfet 132 in a FET diode configuration which ensures that pfet 132 is operating within its saturated region of operation when $V_{dd}$ is larger than the threshold voltage of pfet 132. Resistor 134 provides a bias current path to ground for current flowing from the source of pfet 132 to the drain of pfet 132. It is understood that ground may represent chassis ground and may be at some other voltage than absolute ground, likewise $V_{dd}$ represents the necessary supply voltage for the transistors and other electronics to properly function, not necessarily the signal carrying voltage.

The relation between the voltage across pfet 132 and the bias current $I_{bias}$ of pfet 132 is described by the following equation:

$$I_{bias} = K*W/L*(V_{gs}-V_t)^2$$

where K is the transistor's gain factor, W is the channel width of the transistor, L is the channel length of the transistor, $V_{gs}$ is the gate-to-source voltage and $V_t$ is the threshold voltage of the transistor. The same bias current $I_{bias}$ less the current from the feedback resistor 150 flows through resistor 134. The supply voltage $V_{dd}$ is equal to the sum of $V_{gs}+V_r$, where $V_r$ is the voltage across the resistor 134. The magnitude of the bias current $I_{bias}$, therefore, can be easily established by selecting the resistance of resistor 134 when the other parameters are known, e.g., K and $V_t$ are readily available from a technology manual for the semiconductor technology of choice and the designer chooses $V_{dd}$, W, and L.

Pfet 130 is designed to have the same channel length and threshold voltage as pfet 132. Pfet 130 also has the same gate-to-source voltage as pfet 132 because the gates of pfet 132 and pfet 130 are electrically coupled, and the sources of pfet 130 and pfet 132 are electrically coupled to $V_{dd}$. The value of K in the above equation is the same for both pfet 130 and pfet 132 because they are designed to have the same characteristics and are constructed in the same semiconductor chip. From the equation above, then, the drain-to-source current of pfet 130 is simply equal to the drain-to-source current of pfet 132 multiplied by the ratio of the width of pfet 130 to the width of pfet 132, providing that pfet 130 is also operating in its saturated region of operation.

An n-type fet 140 provides the same constant current source of near equal but opposite magnitude as pfet 130. Nfet 142 and resistor 144 establish the constant bias voltage to nfet 140 and operate much the same way as described above. It is preferable that the current through nfet 140 and pfet 130 have the same magnitude, i.e., the currents are matched.

The current from the drain of pfet 130 is directed to a current steering network which drives a complementary input to a complementary output and to ground through nfet 140. In the preferred embodiment, the current steering network may be arranged as an H-bridge differential driver, although other differential drivers could be substituted. The current from the drain of pfet 130 is input to the sources of pfets 152 and 162, wherein pfet 152 connected drain to drain of nfet 154 comprises one leg of the H and the other pfet 162 is connected drain to drain of nfet 164 and comprises the other leg of the H. The sources of nfet 154 and nfet 164 are then connected to the drain of nfet 140 for a path to chassis ground. The gates of the pfet 152 and nfet 154 are connected to one polarity of the complementary input 180; and the gates of the pfet 162 and nfet 164 are connected to the other polarity of the complementary input 190. Two terminating resistors 122 and 124 and a center tap 126 between the two terminating resistors at the bridge between the two legs provide a center tap terminator 120. In the preferred embodiment as a differential driver, a differential output at 156 and 166 may be connected to a standard transmission line having an impedance matching that of the center tap terminator 120 which may, for example, be one hundred ohms, or two single ended fifty ohm transmission lines routed side by side on a printed circuit card. The total load driven by the differential driver 100 is the combination of the terminating resistor 122 in series with terminating resistor 124, all in parallel with the impedance of the transmission cable at the complementary outputs 156 and 166.

The operation of the current steering network embodied as an H-bridge differential driver will now be discussed. Where A1 180 and B1 190 are complementary inputs, as input A1 180 increases, nfet 154 turns on and pfet 152 turns off. Similarly, as B1 input 190 decreases, pfet 162 turns on and nfet 164 turns off so the current comes through a voltage supply $V_{dd}$ through pfet 130 through pfet 162 into terminating resistors 124 and 122 and down through nfet 164 and nfet 140. If the complementary signal, B1 190, increases larger than A1 180, then the current flows from pfet 130 through pfet 152, the terminating resistors 122 and 124, through nfet 164 and to nfet 140. Thus, the current always travels through one upper leg of the H-bridge and an opposite lower leg of the H-bridge.

The invention provides an electrical connection from the center tap 126 of the center tap terminator 120 to a feedback network. This feedback network maintains a constant average common mode voltage at the center tap 126 and the outputs 156 and 166. It is desirable to have a constant average common mode voltage and a constant output impedance to avoid reflections along the transmission line at the outputs 156 and 166. An average common mode voltage at the center tap 126 between the terminating resistors 122 and 124 is connected between two feedback resistors 150 and 160 in accordance with the invention to stabilize the current mirrors at pfet 132 and nfet 142. Typically, the average common mode voltage may be $(V_{dd}-V_{ground})/2$, but in certain applications, an offset voltage may be applied such that a chip having one operating voltage is able to drive a complementary output to a chip having a different operating voltage. Note that the other ends of feedback resistors 150 and 160 are connected to the gates of their respective current sources, pfet 130 and nfet 140. Without the feedback network, if the gate bias voltage on pfet 130 is stronger than the gate bias voltage on nfet 140, the voltage at the center tap 126 will be greater than the average common mode voltage. With the two feedback resistors 150 and 160, however, when the current through pfet 130 is too high, then the bias voltage across resistor 134 increases which reduces the gate to source voltage at pfet 132 which then tends to decrease the bias voltage at the gate of pfet 130 so that the current through pfet 130 is diminished. Similarly, when the voltage at center tap 126 is less than the average common mode voltage, the current through resistor 160 increases which reduces the current through nfet 142 which in turn creates a smaller bias voltage on the gate of nfet 140, so that nfet 140 draws less current while at the same time pfet 130 is supplying more current so that the voltage at the center tap 126 tends to rise. By adding the feedback network from the center tap terminator 120 to the current mirror reference created by the pfet 132 and resistor 134 and similarly another current mirror reference at nfet 142 with resistor 144, the current in the feedback resistors 150 and 160 resulting from the voltage at the center tap 126 drives the current sources pfet 130 and nfet 140 in the right direction to stabilize the average common mode voltage at the center tap 126, i.e., if the bias voltage at their respective gates increases, the current from the current sources pfet 130 and nfet 140 decrease, and if the bias voltage at their respective gates decreases, the current from the current sources pfet 130 and nfet 140 increase.

Given typical resistor values for the terminating resistors 122 and 124 of fifty ohms each, the feedback resistors 150 and 160 of two kilohms each, and the bias resistors of 134 and 144 of one kilohm each, then, for example, if the voltage at the center tap voltage 126 rises approximately 150 millivolts, the current in the feedback resistor will decrease by approximately 50 microamps. If the nominal current in the current mirror reference is designed to be one milliamp, the current in the pfet 130 will be reduced by approximately five percent. This voltage change will conversely cause the current in the current source nfet 140 to be increased by approximately five percent. It has been demonstrated the variation in the average common mode voltage and the output impedance are improved by a factor of three to four with implementation of the feedback resistor network on a current mode H-bridge differential driver. This amount of correction is more than adequate to correct for typical resistor values and the tolerances achieved with typical CMOS manufacturing processing.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A stabilized current mode differential driver, comprising:
   (a) a pfet current source;
   (b) an nfet current source;
   (c) a current steering network connected to the pfet current source and the nfet current source;
   (d) a center tap terminator connected to the current steering network;
   (e) a feedback network connected to the center tap terminator to provide feedback to the pfet current source and the nfet current source to maintain a constant average common mode voltage, the feedback network comprising:
      (i) a first feedback resistor connected to a gate of the pfet current source; and
      (ii) a second feedback resistor connected to a gate of the nfet current source.

2. The current mode differential driver of claim 1, further comprising:
   (a) a first pfet current mirror reference connected to the gate of the pfet current source; and
   (b) a second nfet current mirror reference connected to the gate of the nfet current source;
      the first feedback resistor also connected to the first pfet current mirror reference and the second feedback resistor also connected to the second nfet current mirror reference.

3. The current mode differential driver of claim 1, further comprising:
   (a) a complementary signal driving the current steering network.

4. The current mode differential driver of claim 3, wherein the current steering network comprises:
   (a) two pfets, the sources of each being connected to a drain of the pfet current source and the gates of each being connected to each of the complementary signal;
   (b) two nfets, the sources of each being connected to the drain of the nfet current source and the gates of each being connected to each of the complementary signal and the drain of one nfet being connected to the drain of one pfet.

5. The current mode differential driver of claim 4, further comprising a differential output.

6. The current mode differential driver of claim 1, wherein the driver drives a transmission line having an impedance matching that of the center tap terminator.

7. A current mode differential driver, comprising:
   (a) a first current mirror;
   (b) a first current source having a first bias voltage provided by the first current mirror, the first current mirror and the first current source connected to a supply voltage;
   (c) a second current mirror;
   (d) a second current source having a second bias voltage provided by the second current mirror, the second current mirror and the second current source connected to a ground voltage;
   (e) a first input connected to the gates of one leg of an H-bridge differential driver;
   (f) a second input connected to the gates of a second leg of the H-bridge differential driver, the first and second input being complementary signals;
   (g) a center tap terminator comprising a first terminating resistor and a second terminating resistor, the center tap terminator connected between a first complementary output at the center of the first leg and between a second complementary output at the center of the second leg,
   (h) a resistor feedback network in which a center tap of the center tap terminator is connected between a first feedback resistor of the resistor feedback network and a second feedback resistor of the resistor feedback network, the first feedback resistor connected to the first bias voltage of first current source and the second feedback resistor connected to the second bias voltage of the second current source; wherein the feedback resistor network is configured to maintain an average common mode voltage at the center tap.

8. A method to stabilize the output of a current mode differential driver, comprising the steps of:
   (a) providing a first current to the current mode differential driver;
   (b) providing a second current to the current mode differential driver;
   (c) providing a center tap terminator at an output of the current mode differential driver;
   (d) adjusting a voltage at a center tap of the center tap terminator to adjust the first current and/or the second current to maintain a constant average common mode voltage at the center tap by connecting the center tap to a first feedback resistor, and connecting the first feedback resistor to a gate of a first current source for providing the first current; and connecting the center tap to a second feedback resistor, and connecting the second feedback resistor to a gate of a second current source for providing the second current, so that the center tap is connected between the first and second feedback resistors.

9. A stable H-bridge differential driver, comprising:
   (a) means to provide current to the H-bridge differential driver;
   (b) means to input a complementary signal to the H-bridge differential driver;
   (c) means to direct the current through the H-bridge differential driver based on the complementary signal;
   (d) means to maintain an average common mode voltage at a center tap of the H-bridge differential driver to be substantially constant, said maintaining means comprising a feedback resistor network connected between the center tap and the means to provide current.

\* \* \* \* \*